Feb. 13, 1968 B. J. STERN 3,369,130

GATING CIRCUIT FOR SETTING, RESETTING, AND CHANGING THE STATE OF A TRANSISTOR FLIP-FLOP FOR VOLTAGE LEVEL INPUT CHANGES

Filed Aug. 31, 1966

INVENTOR
Barry J. Stern

United States Patent Office 3,369,130

Patented Feb. 13, 1968

3,369,130

GATING CIRCUIT FOR SETTING, RESETTING, AND CHANGING THE STATE OF A TRANSISTOR FLIP-FLOP FOR VOLTAGE LEVEL INPUT CHANGES

Barry J. Stern, % Indiana Instruments, Inc., P.O. Box 2112, Hammond, Ind. 46323

Filed Aug. 31, 1966, Ser. No. 576,317
1 Claim. (Cl. 307—247)

ABSTRACT OF THE DISCLOSURE

The present invention discloses the art of interconnecting two monostable multivibrators to form a bistable multivibrator. Controlling the state of the resulting bistable multivibrator for sequential circuitry applications such as counters and shift registers is determined by applied voltage levels and their changes to the inputs of the monostable multivibrators. No diodes are used and the entire circuitry can consist of four interchangeable transistors, four interchangeable collector load resistors, eight interchangeable base resistors, and two interchangeable timing capacitors. Voltage switching at high speeds is attainable.

The present invention relates to a novel gating circuit for setting, resetting, and changing the state of a transistor flip-flop for voltage level input changes.

It is an object of the present invention to provide a novel gating circuit for setting, resetting, and changing the state of a transistor flip-flop for voltage level input changes which comprises no diode gates.

It is an object of the present invention to provide a novel gating circuit for setting, resetting, and changing the state of a transistor flip-flop for voltage level input changes which comprises two transistors, each of these transistors being interchangeable and forming monostable multivibrators with the flip-flop transistors.

The invention, both as to the means and methods employed therein, will be better understood by reference to the following specification and the drawings forming a part thereof, wherein.

Figures 1, 2:
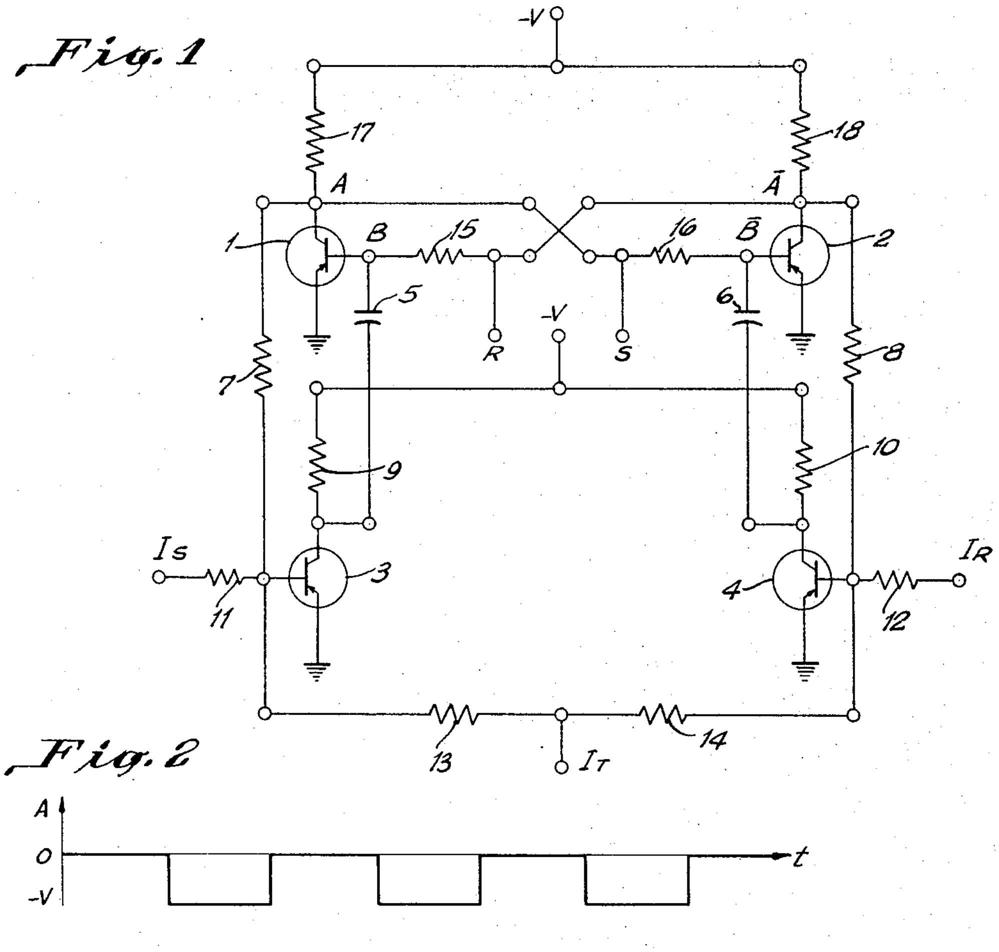
FIGURE 1 illustrates a circuit schematic of the novel gating circuit with connection to a transistor flip-flop.
FIGURE 2 illustrates the collector waveform of the transistor flip-flop for a square wave voltage input to the gating circuit.
Figure 3:
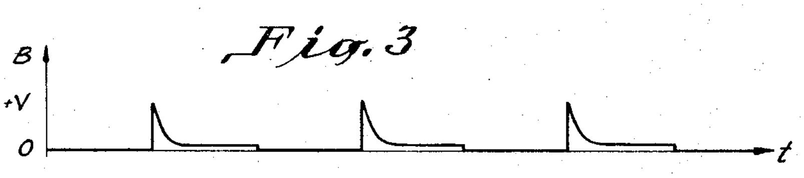
FIGURE 3 illustrates the base waveform of the transistor flip-flop for a square wave voltage input to the gating circuit.
Figure 4:
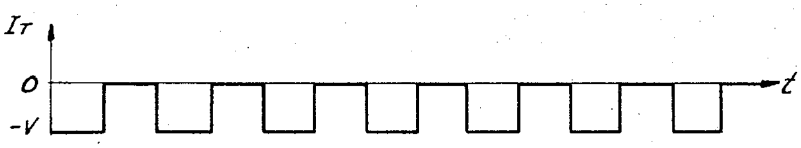
FIGURE 4 illustrates the square wave voltage input to the gating circuit.

The operation of the gating circuit may be followed by considering normal output transistor 1 on, inverted output transistor 2 off, $I_T$ at 0 volts and $I_R$ and $I_S$ not in use (0 volts). Then from FIGURE 1 set transistor 3 is off and reset transistor 4 is on. Thus capacitor 5 is charged to —V volts and capacitor 6 is uncharged. A subsequent change of $I_T$ to —V volts results in turning set transistor 3 on which discharges capacitor 5 resulting in a positive pulse (FIGURE 3) being applied to the base of transistor 1 turning it off. A return of $I_T$ to zero volts now allows reset transistor 4 to go off and capacitor 6 becomes charged to —V volts through the base of the on transistor. A subsequent change of $I_T$ to —V volts repeats the cycle.

If $I_R$ or $I_S$ are placed at —V volts and $I_T$ subject to voltage level input changes the following truth table results, where *t* denotes the present time and *t*+1 denotes the next instant of time.

| A<br>t | $I_R$<br>t | $I_S$<br>t | $I_T$<br>t | $I_T$<br>t+1 | A<br>t+1 |
|---|---|---|---|---|---|
| 0 | 0 | 0 | 0 | 1 | 1 |
| 0 | 0 | 1 | 0 | 1 | 1 |
| 0 | 1 | 0 | 0 | 1 | 0 |
| 0 | 1 | 1 | 0 | 1 | 0 |
| 1 | 0 | 0 | 0 | 1 | 0 |
| 1 | 0 | 1 | 0 | 1 | 1 |
| 1 | 1 | 0 | 0 | 1 | 0 |
| 1 | 1 | 1 | 0 | 1 | 1 |

If $I_T$ is placed at 0 volts and $I_R$ and $I_S$ subject to voltage level input changes the following truth table results, where *t* denotes the present time and *t*+1 denotes the next instant of time.

| A<br>t | $I_R$<br>t | $I_S$<br>t | $I_R$<br>t+1 | $I_S$<br>t+1 | A<br>t+1 |
|---|---|---|---|---|---|
| 0 | 0 | 0 | 0 | 0 | 0 |
| 0 | 0 | 0 | 0 | 1 | 1 |
| 0 | 0 | 0 | 1 | 0 | 0 |
| 0 | 0 | 0 | 1 | 1 | 1 |
| 1 | 0 | 0 | 0 | 0 | 1 |
| 1 | 0 | 0 | 0 | 1 | 1 |
| 1 | 0 | 0 | 1 | 0 | 0 |
| 1 | 0 | 0 | 1 | 1 | 0 |

In order to change the state of the transistor flip-flop an amount of charge must be supplied to the transistor flip-flop loop in a given amount of time. This charge and transfer time depends on the characteristics of the transistors, operating biases of the transistors, external circuitry of the flip-flop, and point of entry to the transistor flip-flop loop. This charge may be measured experimentally or calculated from idealized models. This charge is supplied by capacitor 5 and 6 to the base of the on transistor as a positive pulse. The values of capacitor 5 and 6 and the swing and rise time of the input voltage to transistor 3 and 4 to deliver this charge may be determined experimentally or calculated from idealized models.

The resolution time, the time before another change of state may be initiated, depends on the time constants presented by energy storage elements, capacitor 5 and 6 and transistor junction capacitances, and the apparent external impedance at the terminals of these energy storage elements. The larger the values of capacitor 5 and 6 the longer the resolution time. This resolution time may be measured experimentally or calculated from idealized models.

The value of resistor 13 and 14, 7, 8, 9 and 10, 11, 12 and their respective input voltage $I_T$, A, $\bar{A}$, —V, $I_S$, and $I_R$ must be adjusted so that the resulting collector voltage change as coupled through the capacitor to the off base does not produce a race condition. One way of realizing this condition is to adjust the values of resistor 7 and 8 and their input voltage A and $\bar{A}$ with respect to resistor 9 and 10 and their input voltage —V, so that the set and reset transistors 3 and 4 are saturated.

It is contemplated that numerous variations and modifications within the purview of those skilled in the art can be made in the gating circuit for setting, resetting, and changing the state of a transistor flip-flop for voltage level input changes, and it is intended to cover in the appended claim all such variations and modifications as fall within the true spirit and scope of the invention.

What is claimed is:

1. A gating circuit for setting, resetting, and changing the state of a transistor flip-flop for voltage level input changes, said circuit comprising: two transistors, one of said two transistors forming a monostable multivibrator with the normally off transistor of said flip-flop, the other of said two transistors forming a monostable multivibrator with the normally on transistor of said flip-flop, said two transistors being interchangeable with the flip-flop transistors, a capacitor connected from the base of the flip-flop normal output transistor to the collector of the gating circuit set transistor, a capacitor connected from the base of the flip-flop inverted output transistor to the collector of the gating circuit reset transistor, a resistor connected from the collector of the gating circuit set transistor to a power supply terminal post, a resistor connected from the collector of the gating circuit reset transistor to a power supply terminal post, a resistor only connected from the collector of the flip-flop normal output transistor to the base of the gating circuit set transistor, a resistor only connected from the collector of the flip-flop inverted output transistor to the base of the gating circuit reset transistor, a resistor connected from the base of the gating circuit set transistor to a set input terminal post, a resistor connected from the base of the gating circuit reset transistor to a reset input terminal post, a resistor connected from the base of the gating circuit set transistor to the change of state input terminal post, a resistor connected from the base of the gating circuit reset transistor to the change of state input terminal post, a conducting lead connected from the emitter of the gating circuit set transistor to a ground terminal post, a conducting lead connected from the emitter of the gating circuit reset transistor to a ground terminal post.

References Cited

UNITED STATES PATENTS

| | | | |
|---|---|---|---|
| 2,939,969 | 6/1960 | Kwap et al. | 307—88.5 |
| 3,042,813 | 7/1962 | Johnson | 307—88.5 |
| 3,045,128 | 7/1962 | Skerritt | 307—88.5 |
| 3,067,336 | 12/1962 | Eachus | 307—88.5 |
| 3,178,584 | 4/1965 | Clark | 307—88.5 |
| 3,247,399 | 4/1966 | Moody | 307—88.5 |

ARTHUR GAUSS, *Primary Examiner.*

J. ZAZWORSKY, J. JORDAN, *Assistant Examiners.*